United States Patent [19]
Chen et al.

[11] Patent Number: 6,013,355
[45] Date of Patent: Jan. 11, 2000

[54] TESTING LAMINATES WITH X-RAY MOIRE INTERFEROMETRY

[75] Inventors: William Tze-You Chen, Endicott; Douglas Howard Strope, Apalachin; Natalie Barbara Feilchenfeld, Endicott, all of N.Y.; Yifan Guo, Gilbert, Ariz.; George Dean Ogden, Binghamton, N.Y.

[73] Assignee: International Business Machines Corp., Armonk, N.Y.

[21] Appl. No.: 08/774,731

[22] Filed: Dec. 30, 1996

[51] Int. Cl.[7] ................ B32B 3/00; H01L 23/29
[52] U.S. Cl. ............. 428/209; 428/432; 428/689; 428/210; 257/797
[58] Field of Search .............. 428/208, 209, 428/432, 689, 210; 257/797; 382/151, 184; 378/36; 438/5, 6, 401, 462, 974

[56] References Cited

U.S. PATENT DOCUMENTS

| | | | |
|---|---|---|---|
| 4,174,478 | 11/1979 | Franks | 250/276 |
| 4,327,292 | 4/1982 | Wang et al. | 250/491 |
| 4,664,524 | 5/1987 | Hattori et al. | 356/401 |
| 4,757,207 | 7/1988 | Chappelow et al. | 250/491.1 |
| 4,760,265 | 7/1988 | Yoshida et al. | 250/492.2 |
| 5,003,600 | 3/1991 | Deason | 380/54 |
| 5,168,513 | 12/1992 | Maldonado et al. | 378/34 |
| 5,173,928 | 12/1992 | Momose et al. | 378/4 |
| 5,189,494 | 2/1993 | Muraki | 356/401 |
| 5,229,320 | 7/1993 | Ugajin | 437/107 |
| 5,262,257 | 11/1993 | Fukada et al. | 430/5 |
| 5,294,975 | 3/1994 | Norman et al. | 356/400 |
| 5,333,050 | 7/1994 | Nose et al. | 356/356 |
| 5,396,335 | 3/1995 | Hasegawa et al. | 356/401 |
| 5,700,732 | 12/1997 | Jost et al. | 438/401 |
| 5,869,386 | 2/1999 | Hamajima et al. | 438/455 |

OTHER PUBLICATIONS

Sharam, "Photolithographic Mask Aligner Based on Modified Moire Technique," Optical/Laser Microlithography VII Santa Clara, CA USA 22–24 Feb. 1995.

*Primary Examiner*—Deborah Jones
*Assistant Examiner*—Stephen Stein
*Attorney, Agent, or Firm*—William N. Hogg

[57] ABSTRACT

Registration of the layers in a multilayer electronic device is tested and measured by X-ray moire interferometry.

8 Claims, 3 Drawing Sheets

TESTING LAMINATES WITH X-RAY MOIRE INTERFEROMETRY

BACKGROUND OF THE INVENTION

The present invention relates to an improved technique for testing and measuring electronic multilayer laminates to determine if the layers thereof are properly registered.

Multilayer circuit boards and other multilayer electronic devices are manufactured by preparing individual layers and joining them together typically with lamination using heat and pressure. Typically, these laminate layers are composed of a dielectric material which is provided one or both surfaces thereof having a metallized coating defining an electrical circuitry pattern. In manufacture, the layers are brought together in juxtaposed relation so that the layers are aligned with one another. Desirably, the layers remain in registration after the lamination process so that a multilayer product is produced with the different layers in desired registered relation.

In manufacture of multilayer circuit boards or cards, multichip modules and chip carriers and the like, it is not uncommon for the respective laminate layers, or portions thereof, to become out of registration during the lamination process. This is due to a number of reasons including stresses in the assembly due to temperature and pressure, relative motion of the different layers during the lamination process, changes in shape of the laminate layers as a result of curing, and so forth.

Because of this phenomenon, it is not uncommon in industry for electronic multilayer structures, after they are made, to be tested to determine if the individual layers thereof are in proper registration. Normally, this is done by including, an X-ray dot (i.e., a dot of a material responsive to X-ray radiation) at a specified and known geometric location in the layers to be tested and then irradiating the laminate with X-ray radiation. The pattern of X-ray radiation passing out of the laminate is then read to determine if the two dots, and hence the layers containing the dots, are in registration. The measurement of the actual distance between the features provides information on the total overall positional differences between conductors and other features located on each interconnection layer of the structure.

As the patterns of electrical circuitry formed in electronic multilayer laminates become more and more complex, the size and spacing of the circuit lines in these patterns becomes smaller and smaller. Also, the spacing of the interlevel connections decreases. Concomitantly, the displacement between layers necessary to make a laminate defective becomes less and less. Unfortunately, the above-described X-ray dot technique is becoming inadequate to measure these small displacements, since its sensitivity is inherently limited. For example, future designs will require measurement sensitivities on the order of 50 ppm or less for small boards, e.g. 10×10 inches or less, which is not possible using X-ray dot technology alone.

In addition, due to the increased complexity of the individual layers and therefore their cost, it is also important to have a method to determine the layer to layer alignment prior to joining the levels together.

Accordingly, there is a need for a new process for testing multilayer circuit boards or cards, multichip modules and chip carriers and other electronic multilayer laminates for layer registration which is simple and easy to carry out and is also far more sensitive than techniques available at the present time.

SUMMARY OF THE INVENTION

In accordance with the present invention, it has been determined that registration testing of the layers of a multilayer circuit board or cards, multichip modules and chip carriers or other multilayer electronic devices can be easily accomplished by X-ray moire interferometry.

Accordingly, the present invention provides a new process for testing an electronic multilayer structure to determine if its individual layers are properly registered, the process comprising including moire patterns responsive to X-ray radiation in the layers to be tested and then irradiating the completed laminate with X-ray radiation to create a moire pattern indicative of the degree of registration of the laminated layers. The use of a moire pattern provides information on layer to layer translation, rotation and distortions (normal and shear) while the current use of x-ray dots provide only information concerning translation.

In addition, the present invention further provides a new electronic multilayer structure which can be easily tested by the above technique, the new structure comprising multiple individual layers at least two of which include respective moire patterns responsive to X-ray radiation.

BRIEF DESCRIPTION OF THE DRAWINGS

The present invention may be more readily understood by reference to the following drawings wherein.

DETAILED DESCRIPTION

Figure 1:
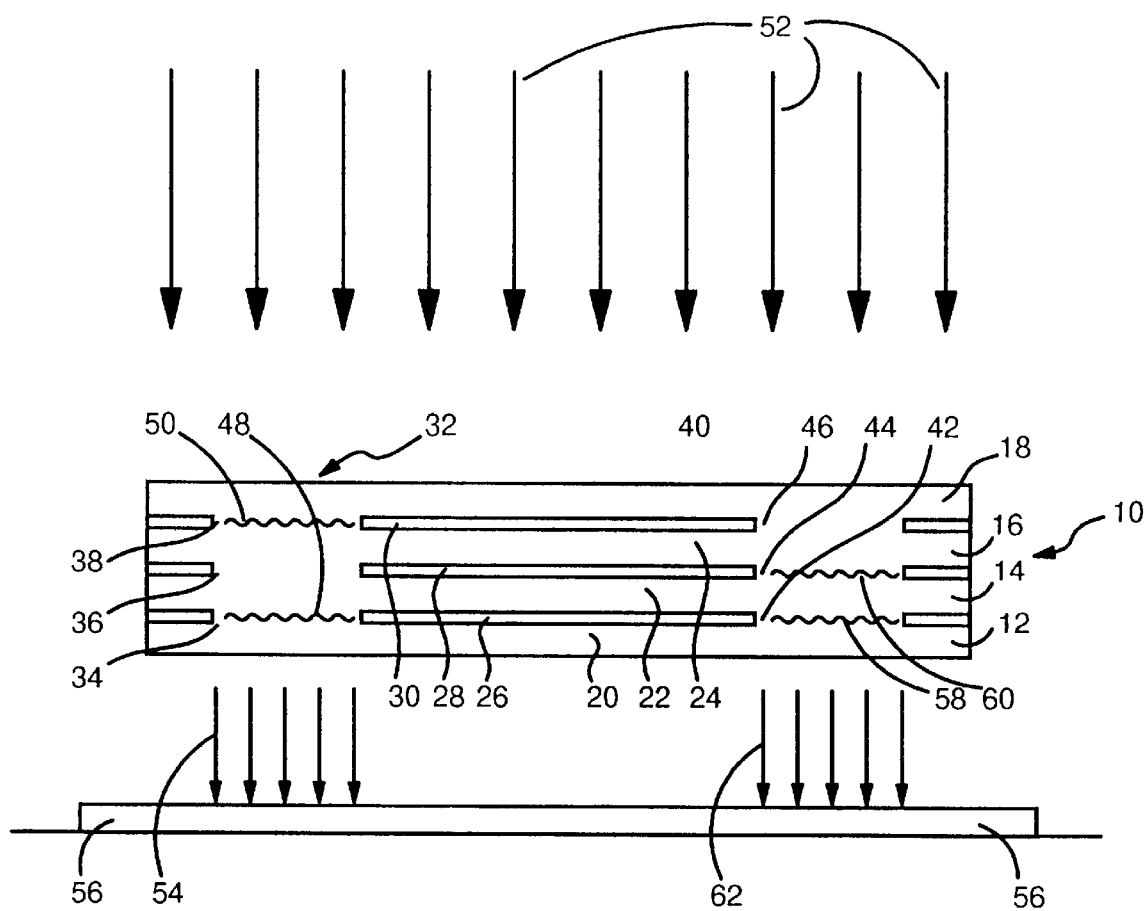
FIG. 1 is a schematic view illustrating an example of the inventive process in which a multilayer circuit board or cards, multichip modules and chip carriers is tested to determine the degree of registration of multiple laminate layers thereof.

As shown in FIG. 1, an electronic multilayer laminate or circuit board or cards, multichip modules and chip carriers generally indicated at 10 is composed of a first laminated layer 12, a second laminated layer 14, a third laminated layer 16 and a covering layer 18. Each of first, second and third laminated layers 12, 14 and 16 is composed of a dielectric layer 20, 22 and 24, respectively, having a metallized coating 26, 28 and 30, respectively, thereon. In the particular embodiment shown, metallized coatings 26, 28 and 30 are formed by photolithographic techniques and define respective electrical circuitry for making electrical connections among various components to be subsequently attached to circuit board 10.

In the particular embodiment shown, metallized coatings 26, 28 and 30 are formed from a metal conventionally used for this purpose, which is preferably copper. In addition, first, second and third laminated layers 12, 14 and 16, as well as covering layer 18, are formed from a suitable dielectric material such as fiber reinforced epoxy resin, such as FR4, polyimide resin, polytetrafluorethylene (PTFE) or any of the other thermoset resins or other materials, including thermoplastics such as PTFE, conventionally used for this purpose.

As appreciated by those skilled in the art, the materials typically used to form dielectric layers in circuit boards or cards, multichip modules and chip carriers and other electronic laminates are not typically transparent to light. Accordingly, conventional circuit boards or cards, multichip modules and chip carriers, as well as circuit board 10 illustrated herein, is opaque to visible light.

Metallized coatings 26, 28 and 30 in a first portion 32 of circuit board 10 are provided with a first set of openings 34, 36 and 38 juxtaposed over one another. In addition, these metallized coatings are provided in a second portion 40 of circuit board 10 with a second set of openings, openings 42, 44 and 46.

Figure 2:
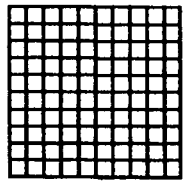
FIG. 2 is a schematic view illustrating a cross-line grating useful in forming a moire pattern in accordance with the present invention.

As illustrated in FIG. 1, opening 34 in metallized coating 26 of first laminate layer 20 and opening 38 of metallized coating 30 in third laminate layer 24 are provided with a pair of moire gratings, moire gratings 48 and 50, respectively. As illustrated in FIG. 2, moire gratings 48 and 50 each take the form of a cross-line pattern, the individual lines of which are formed from a material which is opaque to X-ray radiation. Typically, the lines of moire gratings 48 and 50 will be formed from a metal, and in the preferred embodiment of the invention, these lines are formed at the same time and from the same metal as forming corresponding metallized coatings 26 and 30.

As well appreciated in the art of moire interferometry, the width and spacing of the lines in moire gratings 48 and 50 should be selected so that a moire pattern reflecting the degree of registration of these two moire gratings is achieved by radiation passing therethrough. Thus, the width and spacing of the lines in moire gratings 48 and 50 can be as large as 75 µm and as small as possible, i.e. as small as achievable with available technology. Typically, the width and spacing of the lines in moire gratings 48 and 50 will be 25 µm to 5 µm depending on the magnitude of registration required.

In order to test circuit board 10 in accordance with the present invention, X-ray radiation illustrated by arrows 52 from a source, not shown, located above covering layer 18 is directed at circuit board 10. A portion of this X-ray radiation passes through the openings in first portion 32 of the circuit board as well as moire gratings 48 and 50 therein. As a result, a characteristic moire pattern produced by phase differences in moire gratings 48 and 50 is imparted to the X-ray radiation, represented by arrows 54 in FIG. 1, passing out of circuit board 10 in first area 32 thereof. This pattern is captured in a detector 56 for detecting this moire pattern. In the particular embodiment shown, detector 56 is a sheet of photographic film. Detector 56 can be any other device which is capable of detecting phase differences in moire gratings 48 and 50. Such devices are well known and illustrated, for example, in U.S. Pat. No. 4,760,265 to Yoshida et al., the disclosure of which is incorporated herein by reference.

Once the moire pattern embodied in the radiation passing out of circuit board 10 is captured by detector 56. The distance between the resulting interference pattern features is measured to determine the absolute displacement of the layers. Alternatively, as a process control, it is compared to a pre-determined standard. This comparison can be done, for example, by visually comparing photographic sheet 56 once developed with a suitable standard. This comparison can also be done electronically by suitable comparing equipment of the type illustrated in the above Yoshida et al. 265 patent. If the deviation in registration of laminated layers 12 and 16, as determined by the moire patterns detected in detector 56, is within an acceptable limit, then circuit board 10 passes the test and is an acceptable product. If the moire pattern shows this deviation to exceed the pre-determined limit, circuit board 10 does not pass the test and is regarded as a defective product. In an instance where the multilayer structure is being constructed for the first time, this technique can be used to understand local distortions or misalignments.

In the particular embodiment illustrated in FIG. 1, second area 40 of circuit board 10 is provided with moire gratings 58 and 60 in first laminated layer 12 and second laminated layer 14. Accordingly, the moire pattern developed in detector 56 from X-ray radiation passing out of second area 40 of the circuit board indicates the registration of first layer 12 and second laminated 14, rather than first layer 12 and third layer 16 as in the previously described case. It will therefore be appreciated that registration of multiple laminate layers can be simultaneously measured by the process of the present invention.

Figure 3:
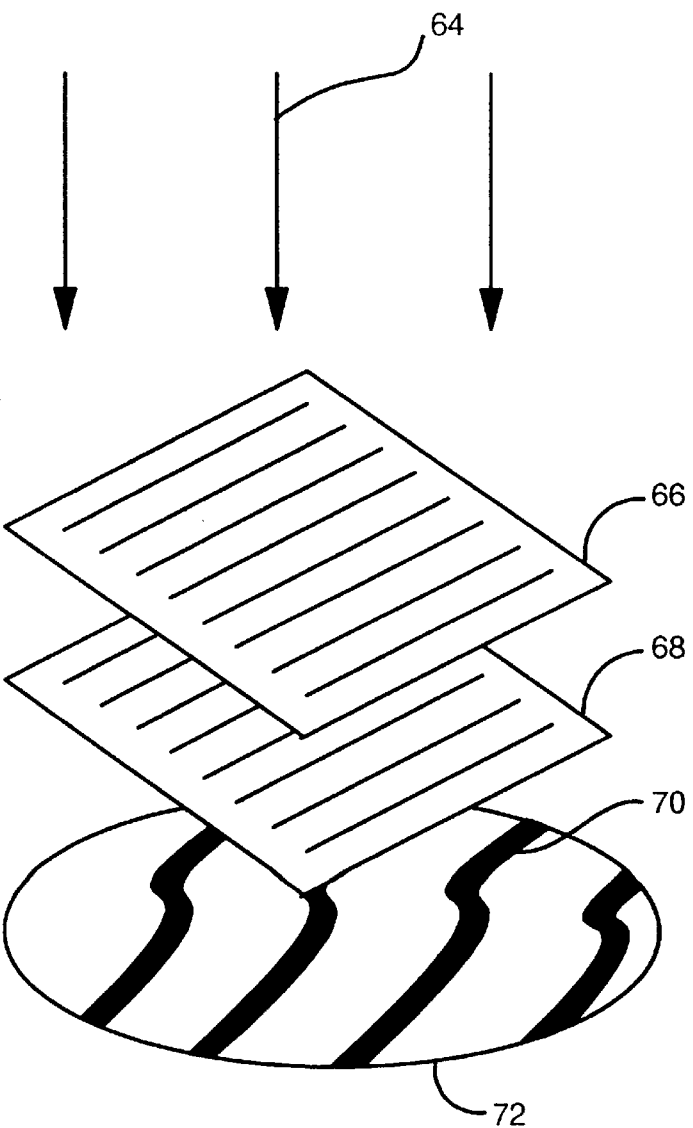
FIG. 3 is another schematic view illustrating two juxtaposed line gratings being irradiated with X-ray radiation in accordance with the present invention.

FIG. 3 illustrates another embodiment of the present invention in which the moire gratings in the different laminated layers are simple line gratings as opposed to the cross-line gratings of FIG. 2. As shown in FIG. 3, X-ray radiation represented by arrows 64 passes through moire gratings 66 and 68 to generate a moire pattern 70 in detector 72. As well appreciated in the art of moire interferometry, the shape of moire pattern or number of fringes 72 provides accurate indication of the registration of gratings 66 and 68.

Figure 4:
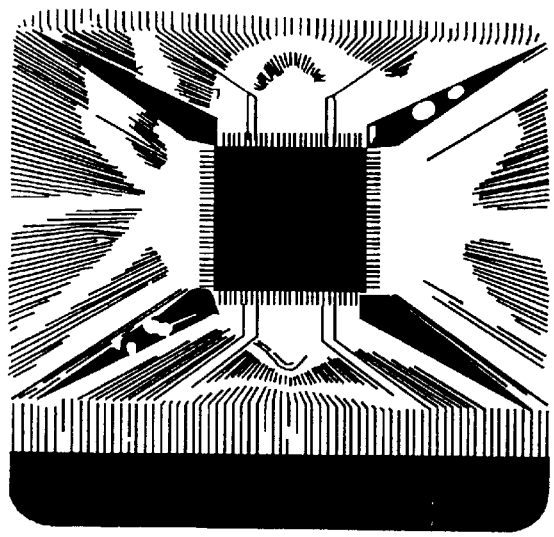
FIG. 4 is an illustration of a moire pattern produced when moire gratings having a geometric configuration are irradiated with X-rays in accordance with the present invention.

FIG. 4 illustrates another embodiment of the present invention in which the moire gratings in the laminated layers of circuit board 10 are formed from a geometric pattern in which at least some of the lines therein radiate outwardly from a central location. This shows that the lines in the moire gratings used in the inventive process need not be exactly parallel.

In a particular example of this embodiment of the invention, the upper moire grating in a pair of gratings takes the form of a plurality of signal redistribution lines arranged in a fan-out configuration on the upper major surface of circuit board 10, i.e. on the upper surface of covering layer 18. Multilayer electronic substrates having redistribution structures on the upper surface thereof for direct connection to chips or other devices are known. Such redistribution structures can take the form of signal redistribution lines formed from copper or other electrical conductor. The signal redistribution lines can themselves be very small and closely spaced. In accordance with this aspect of the present invention, such a redistribution structure is used as one of the two moire gratings in an associated pair of gratings in circuit board 10. In a similar embodiment, the electrical circuitry patterns formed in laminated layers 12, 14 and 16, or at least portions thereof, can also be used as the moire gratings in these layers.

Figure 5:
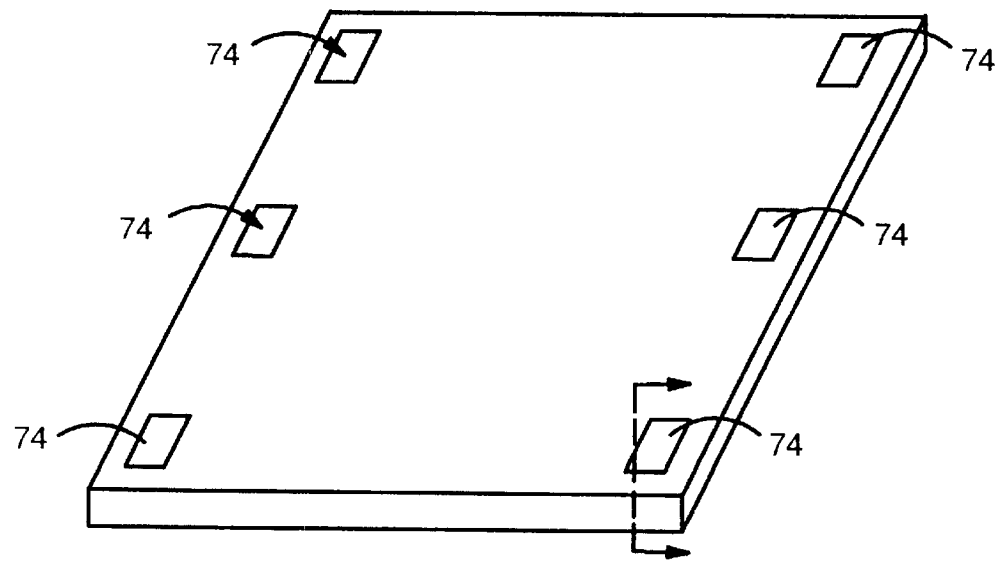
FIG. 5 is a schematic plan view of an electronic multilayer laminate in accordance with the present invention provided with moire gratings in six separate locations for assessing registration of multiple layers in a large sized laminate.

Another embodiment of the present invention is illustrated in FIG. 5. In this embodiment, the circuit board is provided with a plurality of different areas 74 containing associated pairs of moire gratings. Provision of multiple pairs of moire gratings spaced throughout the area of the circuit board allows individual areas of the circuit board to be tested for appropriate registration.

In accordance with still another embodiment of the invention, different pairs of moire patterns in areas 74 have lines of different sizes and spacings. For example, in one area 74, the moire gratings have a width and spacing of about 10 microns (0.4 mil) or less. In another area 74, the lines of the moire grating have a width and spacing of about 25 microns (1 mil). With this structure, registration of the laminate layers being compared can be measured both in a fine and a gross mode. In particular, moire gratings with lines of 10 or less microns allow for highly sensitive measurements of extremely small displacements in registration. On the other hand, moire patterns with larger lines allow for measurement of larger displacements. Accordingly, by use of multiple sets of moire gratings having different line widths and spacings, it is possible to measure both large displacements as well as very small displacements at the same time with a high degree of accuracy.

Although only a few embodiments of the present invention have been described above, it should be appreciated that many modifications can be made without departing from the spirit and scope of the invention. All such modifications are intended to be included within the scope of the present invention, which is to be limited only by the following claims.

We claim:

1. An electronic multilayer laminate having at least first and second laminated layers including respective first and second moire gratings responsive to X-ray radiation, wherein said first and second laminated layers are composed of respective first and second dielectric layers opaque to visible light and respective first and second metallized coatings thereon, said first moire grating being formed in said first metallized coating and said second moire grating being formed in said second metallized coating.

2. The laminate of claim 1, wherein said first and second metallized coatings further define respective first and second patterns of electrical circuitry.

3. The laminate of claim 2, wherein said laminate is selected from the group consisting of multilayer circuit boards, multilayer circuit cards, multichip modules and chip carriers.

4. The laminate of claim 2, wherein said first and second laminated layers each include plural moire gratings, the spacings between the lines defining at least two of the moire gratings in each laminated layer being different from one another.

5. The laminate of claim 2, wherein said moire gratings are line or cross-line gratings.

6. The laminate of claim 2, wherein said moire gratings define a geometric pattern in which at least some of the lines thereof radiate outwardly from a central location.

7. An integrated circuit package containing the laminate of claim 1.

8. An electrical device containing the laminate of claim 1.

* * * * *